US009800019B2

(12) United States Patent
Atia et al.

(10) Patent No.: US 9,800,019 B2
(45) Date of Patent: Oct. 24, 2017

(54) SYSTEM AND METHOD FOR STABILIZING MODE LOCKED SWEPT LASER FOR OCT MEDICAL IMAGING

(71) Applicant: Axsun Technologies, Inc., Billerica, MA (US)

(72) Inventors: Walid A. Atia, Lexington, MA (US); Randal A. Murdza, North Andover, MA (US); Peter S. Whitney, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 14/630,752

(22) Filed: Feb. 25, 2015

(65) Prior Publication Data

US 2015/0171595 A1    Jun. 18, 2015

Related U.S. Application Data

(63) Continuation of application No. 13/729,587, filed on Dec. 28, 2012, now Pat. No. 8,994,954.

(51) Int. Cl.
| | |
|---|---|
| *G01B 9/02* | (2006.01) |
| *H01S 5/065* | (2006.01) |
| *H01S 5/14* | (2006.01) |
| *H01S 5/10* | (2006.01) |
| *H01S 5/30* | (2006.01) |
| *H01S 3/105* | (2006.01) |

(52) U.S. Cl.
CPC ........ *H01S 5/0657* (2013.01); *G01B 9/02004* (2013.01); *G01B 9/02067* (2013.01); *G01B 9/02069* (2013.01); *G01B 9/02091* (2013.01); *H01S 5/1039* (2013.01); *H01S 5/141* (2013.01); *H01S 5/146* (2013.01); *H01S 5/3013* (2013.01); *H01S 3/105* (2013.01)

(58) Field of Classification Search
CPC .... G01B 9/02; G01N 21/4795; A61B 5/0066; A61B 5/6852; A61B 5/0073
USPC ........................................................ 356/479
See application file for complete search history.

(56) References Cited

U.S. PATENT DOCUMENTS

| | | |
|---|---|---|
| 5,473,457 A | 12/1995 | Ono |
| 6,373,632 B1 | 4/2002 | Flanders |
| 6,608,711 B2 | 8/2003 | Flanders et al. |

(Continued)

FOREIGN PATENT DOCUMENTS

WO    WO2012092290 A1 *    7/2012

OTHER PUBLICATIONS

Avrutin, E., et al., "Travelling wave modeling and dynamic properties of short external cavity semiconductor lasers with fast intracavity frequency sweeping for biomedical imaging applications," Submitted to the IEEE Journal of Selected Topics in Quantum Electronics, JSTQE, 2013, pp. 1-8.

(Continued)

*Primary Examiner* — Tarifur Chowdhury
*Assistant Examiner* — Md M Rahman
(74) *Attorney, Agent, or Firm* — HoustonHogle LLP (57) ABSTRACT

An optical coherence analysis system uses a laser swept source that is constrained to operate in a stable mode locked condition by modulating a drive current to the semiconductor optical amplifier as function of wavelength or synchronously with the drive voltage of the laser's tunable element based on stability map for the laser.

16 Claims, 6 Drawing Sheets

(56) References Cited

U.S. PATENT DOCUMENTS

| | | |
|---|---|---|
| 7,415,049 B2 | 8/2008 | Flanders et al. |
| 2006/0187537 A1* | 8/2006 | Huber et al. ............ 359/337.22 |
| 2011/0051143 A1 | 3/2011 | Flanders et al. |
| 2012/0162659 A1 | 6/2012 | Goldberg et al. |
| 2012/0162662 A1 | 6/2012 | Johnson et al. |

OTHER PUBLICATIONS

Bilenca, A., et al., "Numerical study of wavelength-swept semiconductor ring lasers: the role of refractive-index nonlinearities in semiconductor optical amplifiers and implications for biomedical imaging applications," Optics Letters, vol. 31, No. 6, Mar. 15, 2006, pp. 760-762.

* cited by examiner

SYSTEM AND METHOD FOR STABILIZING MODE LOCKED SWEPT LASER FOR OCT MEDICAL IMAGING

RELATED APPLICATIONS

This application is a Continuation of U.S. application Ser. No. 13/729,587, filed on Dec. 28, 2012, which is incorporated herein by reference in its entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections of the object by using information on how the waves are changed upon reflection.

Fourier domain OCT (FD-OCT) currently offers the best performance for many applications. Moreover, of the Fourier domain approaches, swept-source OCT has distinct advantages over techniques such as spectrum-encoded OCT because it has the capability of balanced and polarization diversity detection. It has advantages as well for imaging in wavelength regions where inexpensive and fast detector arrays, which are typically required for spectrum-encoded FD-OCT, are not available.

In swept source OCT, the spectral components are not encoded by spatial separation, but they are encoded in time. The spectrum is either filtered or generated in successive frequency steps and reconstructed before Fourier-transformation. Using the frequency scanning swept source, the optical configuration becomes less complex but the critical performance characteristics now reside in the source and especially its frequency tuning speed and accuracy.

High speed frequency tuning for OCT swept sources is especially relevant to in vivo imaging where fast imaging reduces motion-induced artifacts and reduces the length of the patient procedure. It can also be used to improve resolution.

The swept sources for OCT systems have typically been tunable lasers. The advantages of tunable lasers include high spectral brightness and relatively simple optical designs. A tunable laser is constructed from a gain medium, such as a semiconductor optical amplifier (SOA) that is located within a resonant cavity, and a tunable element such as a rotating grating, grating with a rotating mirror, or a Fabry-Perot tunable filter. Currently, some of the highest tuning speed lasers are based on the laser designs described in U.S. Pat. No. 7,415,049 B1, entitled Laser with Tilted Multi Spatial Mode Resonator Tuning Element, by D. Flanders, M. Kuznetsov and W. Atia. The use of micro-electro-mechanical system (MEMS) Fabry-Perot tunable filters combines the capability for wide spectral scan bands with the low mass, high mechanical resonant frequency deflectable MEMS membranes that have the capacity for high speed tuning.

Certain tradeoffs in laser design, however, can be problematic for OCT systems. Generally, shorter laser cavities translate to higher potential tuning speeds, since laser oscillation must build up anew from spontaneous emission when the laser is tuned. Thus, round-trip travel time for the light in the laser cavities should be kept low so that this build up occurs quickly. Short laser cavities, however, create problems in terms of the spectral spacing of the longitudinal cavity modes of the laser. That is, lasers can only produce light at frequencies which are integer multiples of the cavity mode spacing since the light must oscillate within the cavities. Shorter cavities result in fewer and more widely spaced modes. This results in greater mode hopping noise as the laser is tuned over these discrete cavity modes. So, when designing an OCT laser, there is typically a need to choose between low noise and high speed.

Research with swept tunable lasers has shown that when they are operated at high sweep rates they tend to operate in a mode locked regime. In a mode locked regime optical power of the laser varies on a time scale of the cavity roundtrip time as one or more optical pulses travel in the laser cavity, as is found in a traditional mode locked laser. The pulse repetition rate is close to the laser cavity roundtrip time or to a typically small, say a factor of 2 to 10, multiple. Since this mode locking arises from frequency tuning of the laser, it is termed swept mode locking.

This swept mode locked regime can have the effect of actually facilitating the high-speed tuning of the laser. A four-wave mixing effect red shifts the wave in the laser cavity. This facilitates the tuning to lower optical frequencies. See A. Bilenca, S. H. Yun, G. J. Tearney, and B. E. Bouma, "Numerical study of wavelength-swept semiconductor ring lasers: the role of refractive-index nonlinearities in semiconductor optical amplifiers and implications for biomedical imaging applications", OPTICS LETTERS/Vol. 31, No. 6, Mar. 15, 2006.

Problems, however, often arise when tuning to higher optical frequencies and also during very high speed tuning Generally, this tuning tends to be more unstable. Some of these instabilities probably result from the fact that the laser cavity is changing through the process of tuning, and thus the characteristics that instigate the swept mode locking also change. As a result, the lasers can flip between different swept mode locked regimes during a single frequency scan of the tunable laser. For example, during the sweep, the number of pulses circulating in the cavity can change, causing the lasers to behave chaotically and unpredictably as they move between the different regimes. The different regimes can further result in different performance characteristics as the tunable lasers relate to the OCT systems in which they operate.

SUMMARY OF THE INVENTION

The present invention concerns a swept tunable laser source. During its swept operation, it is constrained to operate in a controlled mode locked regime preferably by controlling the drive current to the laser's gain element, typically a semiconductor optical amplifier.

This has the effect of stabilizing the emission characteristics of the laser and avoids noisy disruptions due to uncertainty or flips in the number of pulses circulating in the cavity. Instead, the mode locking system stabilizes the pulsation behavior of the laser by modulating a gain, for example, of the cavity of the laser synchronously with the sweeping of the laser's tunable element, e.g., Fabry-Perot tunable filter or grating.

In other embodiments described below, the stabilization is accomplished by modulating a lossy element within the cavity.

In general according to one aspect, the invention features an optical coherence imaging method, comprising providing a laser swept source to generate a swept optical signal, modulating a drive signal for a gain element as the swept optical signal is swept through a scan band, transmitting the swept optical signal to an interferometer having a reference arm and a sample arm, in which a sample is located, combining the swept optical signal returning from the sample arm and the reference arm to generate an interference signal, detecting the interference signal, and generating image information of the sample from the detected interference signal.

In embodiments, modulating the drive signal comprises modulating a bias current to a semiconductor optical amplifier. This is preferably done synchronously with a tunable element drive signal.

In general according to another aspect, the invention features an optical coherence analysis system, comprising a swept laser source for generating a swept optical signal that is frequency tuned over a tuning band, a controller for modulating a drive signal for a gain element as the swept optical signal is swept through a scan band, an interferometer for dividing the swept optical signal between a reference arm and a sample arm leading to a sample, and a detector system for detecting an interference signal generated from the swept optical signal from the reference arm and from the sample arm.

In general according to another aspect, the invention features an optical swept source control method, comprising providing a laser swept source to generate a swept optical signal and modulating a drive signal for a gain element as the swept optical signal is swept through a scan band as a function of wavelength to control a mode locked operation.

In general, according to another aspect, the invention features a swept laser system comprising a swept laser source for generating a swept optical signal that is frequency tuned over a tuning band and a controller for modulating a drive signal for a gain element as the swept optical signal is swept through a scan band to control the mode locked operation.

In general according to another aspect, the invention features an optical swept source control method, comprising providing a laser swept source to generate a swept optical signal, generating a stability map as a function of wavelength for the laser swept source, and modulating a drive signal for a gain element based on the stability map.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same or similar parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
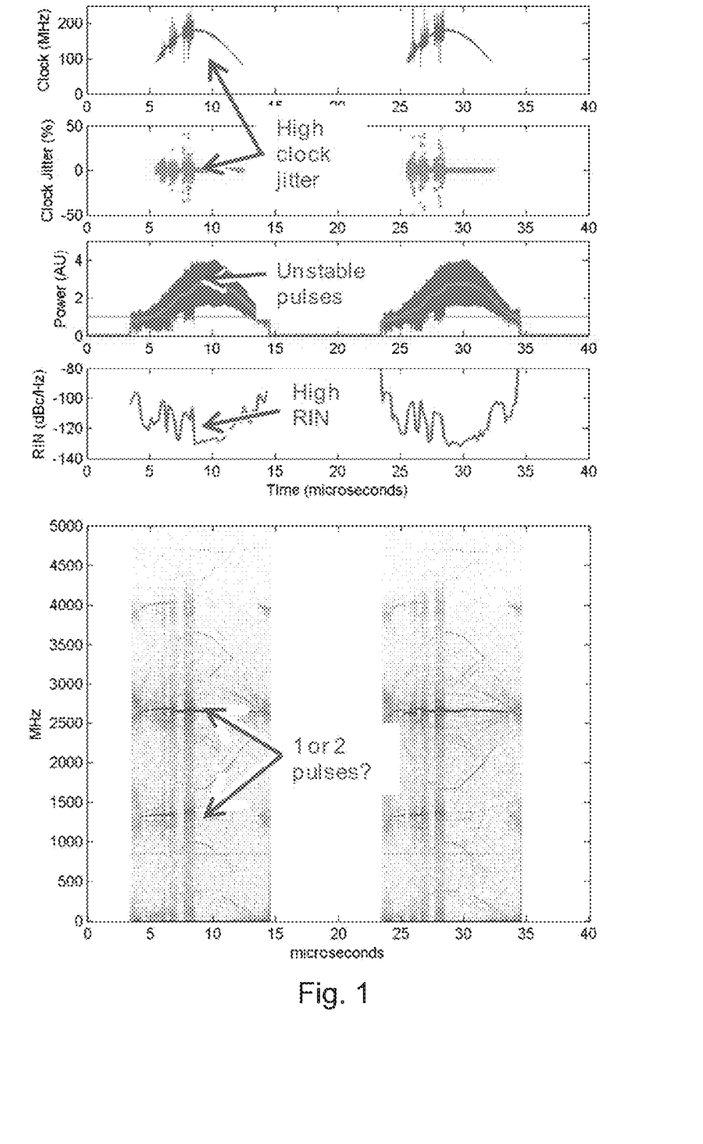
FIG. 1 contains five plots of experimental data on a common timescale in microseconds: clock frequency in MegaHertz, clock jitter in percent, laser power output in arbitrary units, relative intensity noise (RIN) (dBc/Hz), and a spectrogram showing the frequency content vs. time of the laser's instantaneous power output, illustrating a tunable laser source exhibiting swept mode locking during scanning over the tuning band but without stabilization.

FIG. 1 contains plots of the k-clock frequency and clock jitter of the swept optical signal from a passively swept mode locked laser during its frequency sweeping through the scan band where there is no active modulation of the SOA current. The k-clock exhibits high levels of jitter suggesting poor tuning performance. Further, the power output of the swept optical signal from tunable laser is highly unstable over the scan. RIN is also high. The spectrogram shows the existence of pulses in the swept optical signal at approximately 2600 and 1300 MHz. The energy distribution seems to vary over the course of the scan through the tuning band of the laser.

This uncontrolled pulse behavior during the course of the sweep of the swept optical signal through the scan band is believed to be instigated by the changing characteristics of the laser cavity over the scan band.

In uncontrolled lasers, the number of pulses in the laser cavity due to swept mode locking has been observed to change between forward and backward sweeps, and can even switch in the middle of a sweep as illustrated.

Figure 2A:
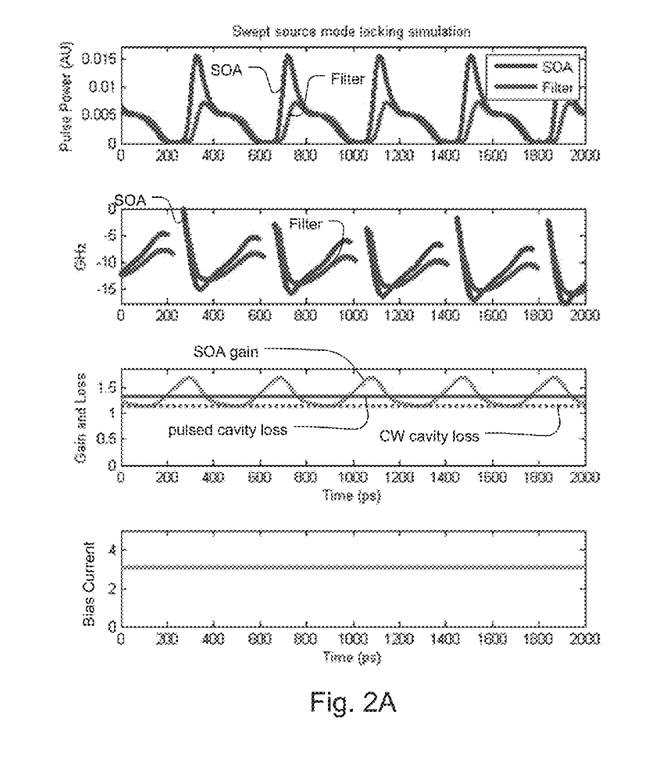
FIG. 2A contains four plots from a computer simulation on a common timescale in picoseconds: optical power for light exiting the SOA 410 and the Fabry-Perot tunable filter 412, the instantaneous optical frequency change of the pulses in GigaHertz (GHz), the gain from the SOA 410 and cavity loss, and the bias current to the SOA 410.
Figure 2B:
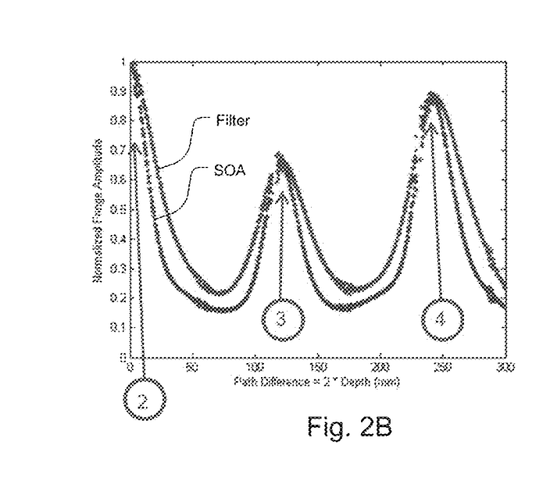
FIG. 2B is a plot of normalized fringe amplitude from a test interferometer as a function of depth in millimeters, illustrating a tunable laser source exhibiting swept mode locking during scanning over the tuning band but without stabilization.

FIGS. 2A and 2B are the results of a computer simulation. It shows a tunable laser exhibiting passive swept mode locking without gain modulation. In this case, the laser operates with 2 pulses per cavity round trip.

The correlation plots of FIG. 2B, one for light exiting the SOA gain element and one for light exiting the tunable filter tuning element, are computer simulations of a swept source coherence length measurement, but carried out to extreme path differences. The usual coherence length measurement occurs at path differences near zero (2). At 120 mm (3) the pulses are interfering with their neighbors. At 240 mm (4) the pulses are interfering with pulses 1 cavity round trip away, which is two pulses apart.

These secondary coherences (3) (4) can sometimes be a problem in practical OCT systems where small stray reflections at lengths nearly corresponding to the cavity length or fractions thereof (depending on the number of pulses per round trip) can produce artifacts in the OCT image.

Figure 3:
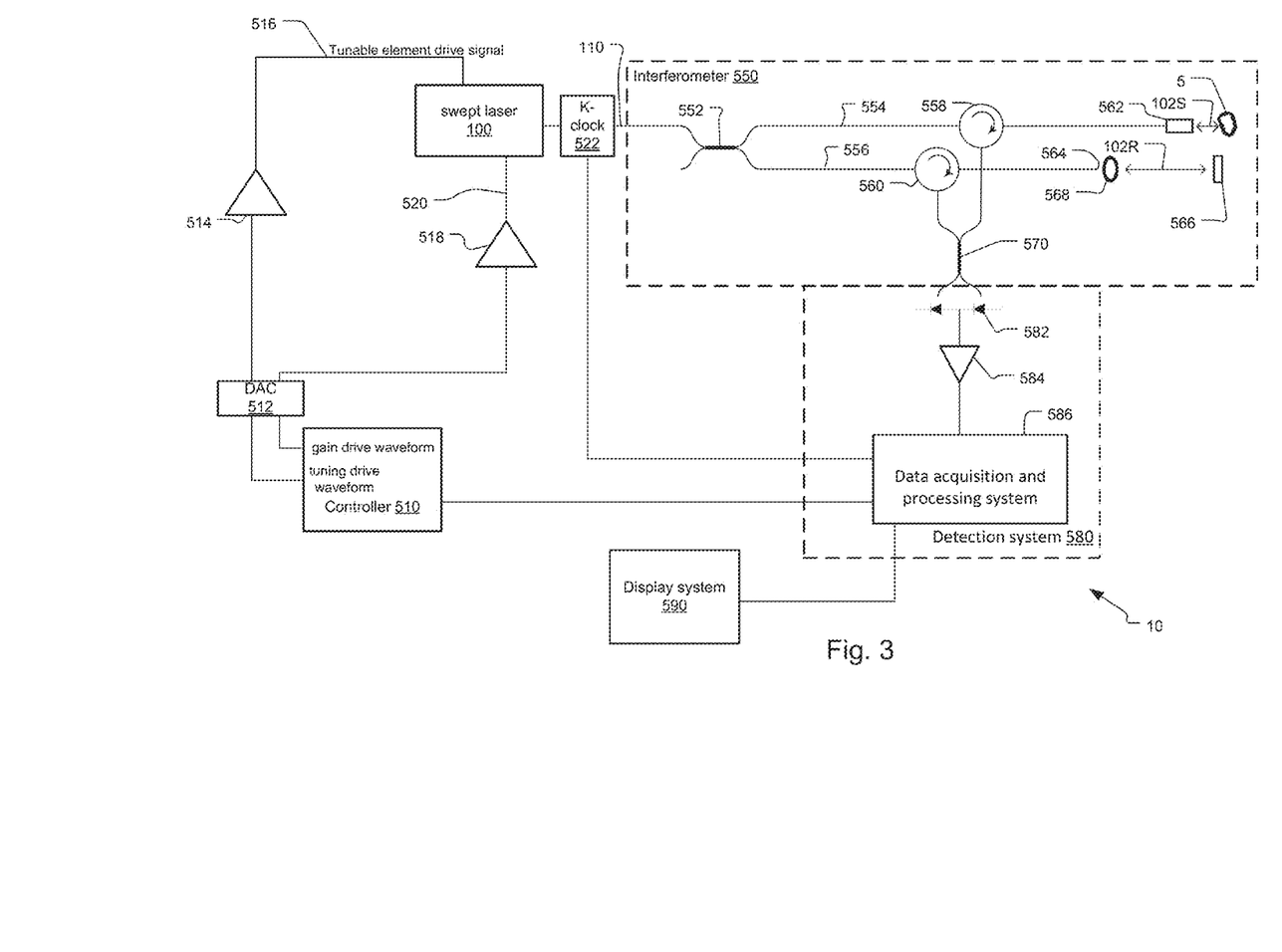
FIG. 3 is a schematic view of an OCT system incorporating the stabilized mode locked swept laser according to an embodiment of the invention.

FIG. 3 shows an optical coherence analysis system 10, such as a tomography system, which has been constructed according to the principles of the present invention.

An optical swept laser 100 generates the tunable or swept optical signal on optical fiber 110 that is transmitted to interferometer 550. The swept optical signal scans over a scan band with a narrowband emission.

The swept laser 100 is generally intended for high speed tuning to generate swept optical signals that repeatedly scan over the scan band(s) at rates of greater than 1 kiloHertz (kHz). In current embodiments, the swept laser 100 tunes at speeds greater than 20 or 100 kHz. In very high speed embodiments, the swept laser 100 tunes at speeds greater than 200 or 500 kHz.

Typically, the width of the tuning or scan band is greater than 10 nanometers (nm). In the current embodiments, it is preferably between 50 and 150 nm, although even wider tuning bands are contemplated in some examples. On the other hand, the bandwidth of the narrowband emission has a full width half maximum (FWHM) bandwidth of less than 20 or 10 GigaHertz (GHz), and is usually 5 GHz or less. For optical coherence tomography, this high spectral resolution implies a long coherence length and therefore enables imaging deeper into samples, for example deeper than 5 millimeters (mm). On the other hand, in lower performance applications, for example OCT imaging less than 1 mm deep into samples, broader FWHM passbands are sometimes appropriate, such as passbands of about 200 GHz or less.

The tuning speed can also be expressed in wavelength per unit time. In one example, for an approximately 110 nm tuning band or scanband and 100 kHz scan rate, assuming 60% duty cycle for substantially linear up-tuning, the peak sweep speed would be 110 nm*100 kHz/0.60=18,300 nm/msec=18.3 nm/μsec or faster. In another example, for an approximately 90 nm tuning range and 50 kHz scan rate, assuming a 50% duty cycle for substantially linear up-tuning, the peak sweep speed is 90 nm*50 kHz/0.50=9,000 nm/msec=9.0 nm/μsec or faster. In a smaller tuning band example having an approximately 30 nm tuning range and 2 kHz scan rate, assuming a 80% duty cycle for substantially linear tuning, the peak sweep speed would be 30 nm*2 kHz/0.80=75 nm/msec=0.075 nm/μsec, or faster.

Thus, in terms of scan rates, in the preferred embodiments described herein, the sweep speeds are greater than 0.05 nm/μsec and preferably greater than 5 nm/μsec. In still higher speed applications, the scan rates are higher than 10 nm/μsec.

A controller 510, via a digital to analog converter (DAC) 512, generates a filter, or tunable element, drive waveform or waveform 516. This tunable element drive signal 516 is amplified by amplifier 514 and applied to the laser's tunable element. In one example, the controller 510 stores the filter drive waveform that linearizes the frequency sweep for one or more tunable optical filters, such as Fabry-Perot tunable filters, tilting gratings, or other tunable optical elements, contained in the swept source system 100.

The controller 510, via the digital to analog converter (DAC) 512, also generates a gain element drive waveform 520, which is amplified by amplifier 518 and applied to the laser's gain element. In one example, the controller 510 stores the gain element drive waveform that stabilizes the frequency sweep by modulating the gain of the gain element with the same periodicity and synchronously with the tunable element drive signal 516. The gain element drive waveform 520 is applied to the gain element, typically a semiconductor optical amplifier, of the swept laser 100. In other embodiments, it is applied to an intra cavity loss element that modulates the gain of the laser's cavity by applying a time varying loss.

A clock system 522 is used to generate k-clock signals at equally spaced optical frequency sampling intervals as the swept optical signal is tuned or swept over the scan or tuning band, in one embodiment.

In the illustrated example, a Mach-Zehnder-type interferometer 550 is used to analyze the optical signals from the sample 5. The swept optical signal from the optical swept laser 100 is transmitted on fiber 110 to a 90/10 optical fiber coupler 552 or other beam splitter, to give specific examples. The swept optical signal is divided between a reference arm 556 and a sample arm 554 of the system 10.

The optical fiber of the reference arm 556 terminates at the fiber endface 564. The light 102R exiting from the reference arm fiber endface 564 is collimated by a lens 568 and then reflected by a reference mirror 566 to return back, in some exemplary implementations.

The reference mirror 566 has an adjustable fiber to mirror distance, in one example. This distance determines the depth range being imaged, i.e. the position in the sample 5 of the zero path length difference between the reference arm 556 and the sample arm 554. The distance is adjusted for different sampling probes and/or imaged samples. Light returning from the reference mirror 566 is returned to a reference arm circulator 560 and directed to an interference signal combiner 570, such as a 50/50 fiber coupler. In other examples, such as those using free space optical configurations, the combiner 570 is a partially reflecting mirror/beam splitter.

The fiber on the sample arm 554 terminates at the sample arm probe 562. The exiting swept optical signal 102S is focused by the probe 562 onto the sample 5. Light returning from the sample 5 is returned to a sample arm circulator 558 and directed to the interference signal combiner 570.

The reference arm signal and the sample arm signal are combined or mixed in the interference signal combiner 570 to generate an interference signal.

The interference signal is detected by a detection system 580. Specifically, a balanced receiver, comprising two detectors 582, is located at each of the outputs of the fiber coupler 570 in the illustrated embodiment. The electronic interference signal from the balanced receiver 582 is amplified by amplifier 584, such as a transimpedance amplifier.

A data acquisition and processing system 586 of the detection system 580 is used to sample the interference signal output from the amplifier 584. The k-clock signals derived from the clock system 522 are preferably used by the data acquisition and processing system 586 to synchronize system data acquisition with the frequency tuning of the optical swept laser 100. In other examples, the swept laser tunes linearly in frequency and/or resampling is used.

In any case, the data acquisition and processing system 586 samples the interference signals to generate evenly spaced samples of the interference signal in the optical frequency domain. A sweep start signal is preferably provided by the controller 510 when a new sweep is to begin.

A complete data set is collected of the sample 5 by spatially raster scanning the focused probe beam point from the probe 562 over the sample 5 in a Cartesian geometry x-y fashion or a cylindrical geometry theta-z fashion. The spectral response at each one of these points is generated from the frequency tuning of the swept laser 100.

The data acquisition and processing system 586 performs a Fourier transform on the data in order to reconstruct the image and perform a 2D or 3D tomographic reconstruction of the sample 5. This transformed data are displayed by the display system 590.

Figure 4:
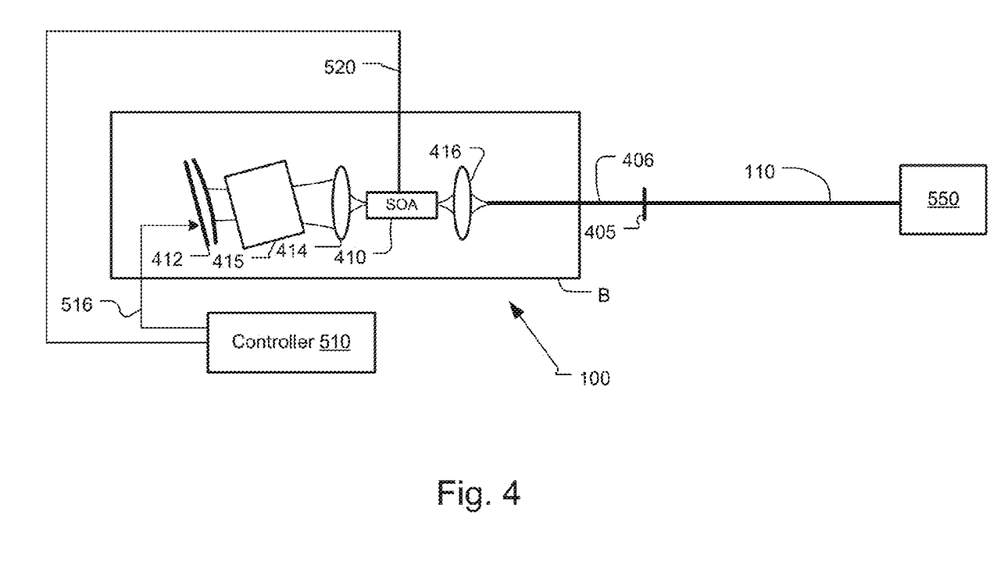
FIG. 4 is a schematic diagram of a passively mode-locked laser swept source for optical coherence analysis having controller for modulating a drive signal for a gain element.

FIG. 4 shows passively mode-locked laser swept source 100 for optical coherence analysis, which has been constructed according to the principles of the present invention. This embodiment controls or stabilizes the mode-locked operation by modulating the bias current to an intracavity gain element synchronously and with the same periodicity of the sweeping of the swept optical signal through the scan band.

In the current embodiment, the laser swept source 100 is preferably a laser as generally described in incorporated U.S. Pat. No. 7,415,049 B1. It includes a linear cavity with a gain element 410 and a frequency tuning element 412, which are preferably implemented on a common optical bench B. In the illustrated example, the frequency tuning element is a reflective Fabry-Perot filter, which defines one end of the cavity, in the illustrated implementation and thus also functions as an end reflector of the laser cavity.

In other embodiments, other cavity configurations are used such as ring cavities. Further other cavity frequency tuning elements are used such as gratings and thin-film filters. In some examples, these tuning elements are mechanically tuned such as rotated or pivoted. These elements can also be located entirely within the cavity such as an angle isolated transmissive Fabry-Perot tunable filter or grating.

Currently, the passband of the Fabry-Perot filter 412 is between 1 and 10 GHz and is tuned over a tuning band or scan band of greater than 10 nanometers (nm), and is usually greater than 50 or 100 nm.

In more detail with respect to the current embodiment, the tunable laser 100 comprises a semiconductor optical amplifier gain chip 410 that is paired with a micro-electro-mechanical (MEMS) angled reflective Fabry-Perot tunable filter 412, which defines one end of the laser cavity. The cavity extends to a second output reflector 405 that is located at the end of a fiber pigtail 406 that is coupled to the bench B and also forms part of the cavity.

Currently, the length of the cavity is at least 40 millimeters (mm) long and preferably over 50 to 80 mm. This ensures close longitudinal mode spacing that reduces mode hopping noise.

In other embodiments, shorter cavities are used. In some of these embodiments, very short cavities with wider passband tuning elements (filters) 412 are used for extremely high speed applications where only short coherence lengths are required. In some of these examples, the passband of the Fabry-Perot filter 412 is between 20 and 40 GHz, or wider. The length of the laser cavity is less than 20 mm or 10 mm, and thus may not extend into optical fiber, but is entirely implemented on the bench B.

The tunable or swept optical signal passing through the output reflector 405 is transmitted on optical fiber 110 or via free space to the interferometer 550 of the OCT system.

The semiconductor optical amplifier (SOA) chip gain element 410 is located within the laser cavity. In the current embodiment, input and output facets of the SOA chip 410 are angled and anti-reflection (AR) coated, providing typically parallel beams from the two facets. In the preferred embodiment, the SOA chip 410 is bonded or attached to the common bench B via a submount.

The material system of the chip 410 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Currently, edge-emitting chips are used although vertical cavity surface emitting laser (VCSEL) chips are used in different implementations.

The use of a semiconductor chip gain medium 410 has advantages in terms of system integration since semiconductor chips can be bonded to submounts that in turn are directly bonded to the bench B.

Each facet of the SOA 410 has an associated lens structure 414, 416 that is used to couple the light exiting from either facet of the SOA 410 in the illustrated free-space version of the laser. The first lens structure 414 couples the light between the back facet of the SOA 410 and the reflective Fabry-Perot tunable filter 412. Light exiting out the output or front facet of the SOA 410 is coupled by the second lens structure 416 to a fiber end facet of the pigtail 406.

In a current implementation, each lens structure comprises a LIGA mounting structure, which is deformable to enable post installation alignment, and a transmissive substrate on which the lens is formed. The transmissive substrate is typically solder or thermocompression bonded to the mounting structure, which in turn is solder bonded to the optical bench B.

The fiber facet of the pigtail 406 is also preferably mounted to the bench B via a fiber mounting structure, to which the fiber 406 is solder bonded. The fiber mounting structure is likewise usually solder bonded to the bench B. Deformable fiber mounting structure typically allows post installation alignment of the fiber for optimal coupling of light from the SOA chip to the fiber.

The angled reflective Fabry-Perot filter 412 is a multi-spatial-mode tunable filter that provides angular dependent reflective spectral response back into the laser cavity. This characteristic is discussed in more detail in incorporated U.S. Pat. No. 7,415,049 B1.

Preferably, the tunable filter 412 is a Fabry-Perot tunable filter that is fabricated using micro-electro-mechanical systems (MEMS) technology and is attached, such as directly solder bonded, to the bench B. Currently, the filter 412 is manufactured using technologies described in U.S. Pat. No. 6,608,711 or 6,373,632, which are incorporated herein by this reference. A curved-flat resonator structure is used in which a generally flat mirror and an opposed curved mirror define a filter optical cavity, the optical length of which is modulated by electrostatic deflection of at least one of the mirrors.

The passively mode-locked laser swept source 100 and the other embodiments discussed hereinbelow are generally intended for high speed tuning to generate tunable swept optical signals that scan over the tuning band or scanband at speeds greater than 1 kiloHertz (kHz). In current embodiments, the laser swept source 100 tunes over the scanband at speeds greater than 50 or 100 kHz. In very high speed embodiments, the mode-locked laser swept source 100 tunes at speeds greater than 200 or 500 kHz.

The controller 510 provides a tuning voltage function to the Fabry-Perot filter 412, which includes a membrane that is electrostatically deflectable to thereby sweep the filter optical passband across the tuning band, preferably with optical frequency varying linearly with time. Typically, the width of the scan or tuning band is greater than 10 nm. In the current embodiments, it is preferably between 50 and 150 nm, although even wider tuning bands are contemplated in some examples.

In one implementation, an extender element 415 is added to the laser cavity. This is fabricated from a transparent, preferably high refractive index material, such as fused silica, silicon, GaP or other transmissive material having a refractive index of ideally about 1.5 or higher. Currently silicon or GaP is preferred. Both endfaces of the extender element 415 are antireflection coated. Further, the element 415 is preferably angled by between 1 and 10 degrees relative to the optical axis of the cavity to further spoil any reflections from the endfaces from entering into the laser beam optical axis.

The extender element 415 is used to change the optical distance between the laser intracavity spurious reflectors and thus change the depth position of the spurious peaks in the image while not necessitating a change in the physical distance between the elements.

The bench B is termed a micro-optical bench and is preferably less than 10 millimeters (mm) in width and about 25 mm in length or less. This size enables the bench to be installed in a standard, or near standard-sized, butterfly or DIP (dual inline pin) hermetic package. In one implementation, the bench B is fabricated from aluminum nitride. A thermoelectric cooler is disposed between the bench B and the package (attached/solder bonded both to the backside of the bench and inner bottom panel of the package) to control the temperature of the bench B. The bench temperature is detected via a thermistor installed on the bench B.

The system and method for stabilizing the mode locked swept laser system 100 of the illustrated embodiment utilizes a controlled drive current to the cavity gain element, SOA 410.

The stable operating regime for passively mode locked swept lasers is a balance between sweep rate, filter bandwidth, cavity losses and gain characteristics in the SOA 410. Unfortunately, these parameters critical to the operation of the laser exhibit significant variation with wavelength, and the wavelength dependence of each of these parameters arises from separate, unrelated characteristics of the system and its components. As such, the variations in the parameters do not, in general, exhibit any simple relationship nor do they necessarily vary in a way that consistently supports stable operation over a wide tuning range. This creates significant challenges in the design and manufacture of high speed swept tunable lasers which cover a range of wavelengths.

To ensure stable operation over a wide range of conditions an optimal laser design would match, for example, a wider filter linewidth with a faster instantaneous sweep rate and a narrower filter linewidth with a slower sweep rate. However, the linewidth for the Fabry-Perot filter 412 typically grows wider towards the edges of the tuning range where the instantaneous tuning rate by necessity is substantially reduced. This is in direct contrast to the optimal design, and results in very tight tolerances for the linewidth variations in the tunable filter 412.

The variation in the gain characteristics of the SOA 410 with wavelength can be even more complex, and places additional constraints on the stable range of filter linewidths and sweep rates. This is influenced, for example, by the strong drop in gain near the band edges of the SOA 412, or, in the case of a quantum well SOA, by the number of energy level transitions involved in establishing the gain spectrum. These variations, both in the gain itself and in the dependence of the gain on drive current, cause shifts in the optimal filter linewidth for stable performance across the wavelength scan band.

To overcome these limitations, the bias point (injected drive current) of the SOA 410 is modulated during the laser sweep in a manner that compensates for the variation in the gain characteristics in the SOA 410 as well as variations in the sweep rate and filter linewidth across the wavelength band of interest.

Figure 5:
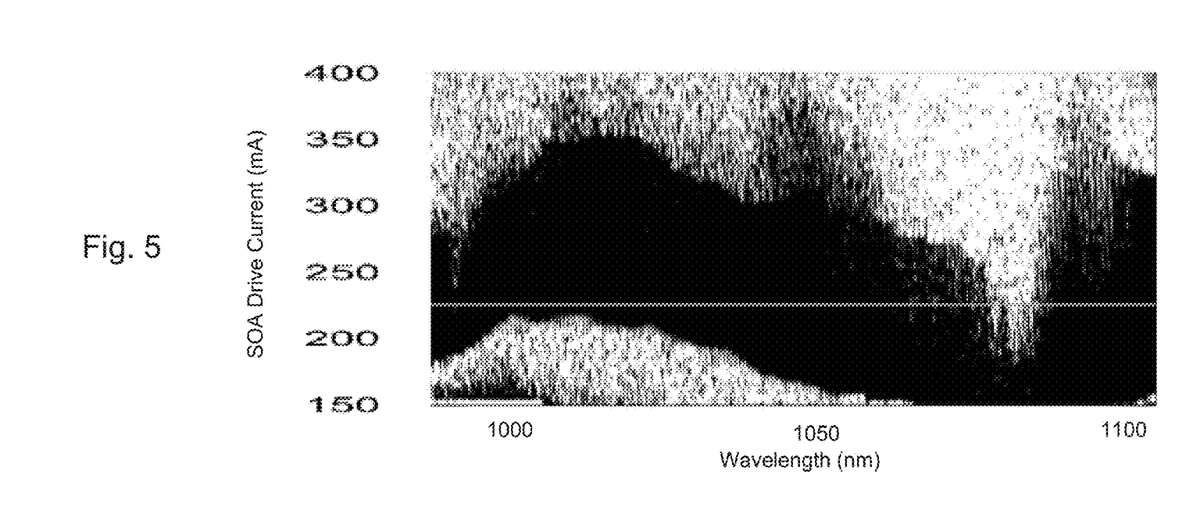
FIG. 5 is a stability map for the laser swept source showing the SOA drive current as function of wavelength for its scan band.

FIG. 5 shows a stability map, such as in the figure below, illustrating the stable (black areas) and unstable (white areas) operating range as a function of SOA drive current and wavelength. In general, the optimal drive current for each wavelength in the scan band is not known a priori, but is evaluated empirically.

In the illustrated map, there is no constant bias current on the SOA 410 that results in stable operation over the entire wavelength range shown.

Figure 6:
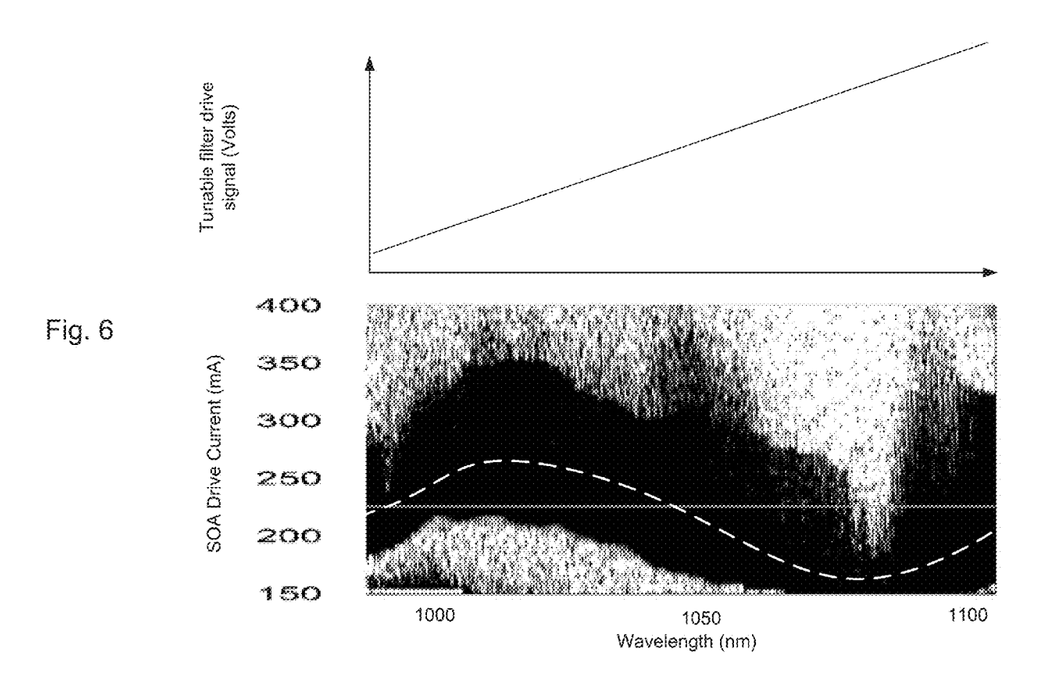
FIG. 6 is a stability map for the laser swept source showing the SOA drive current and tunable filter drive voltage as function of wavelength showing synchronous modulation of both elements.

FIG. 6 shows the stability map plotted with the drive voltage to the tunable filter 410 over the scan band stretching from less than 1000 nm to over 1100 nm. By modulating the drive current 520 synchronously and with the periodicity of the drive signal 516 to the tunable filter 412 along the path illustrated (dotted line), stable operation of the laser 100 over the scan band is achieve with good operating margin. In practice this is done by synchronizing the SOA current modulation drive waveform 520 with the filter sweep drive waveform 516. Both of these waveforms being stored as lookup tables, for example, by the controller 510.

While this invention has been particularly shown and described with references to preferred embodiments thereof, it will be understood by those skilled in the art that various changes in form and details may be made therein without departing from the scope of the invention encompassed by the appended claims. For example, although the invention has been described in connection with an OCT or spectroscopic analysis only, the invention could also be applied along with IVUS, FLIVUS, HIFU, pressure sensing wires and image guided therapeutic devices.

What is claimed is:

1. An optical swept source control method, comprising:
providing a laser swept source and generating a swept optical signal with the laser swept source; and
modulating a drive signal for a gain element as the swept optical signal is swept through a scan band as a function of wavelength of the swept optical signal to control a passive mode locked operation controlling the drive signal to trace a path between unstable operating ranges of lower drive signals and higher drive signals over the scan band in wavelength.

2. The method as claimed in claim 1, wherein modulating the drive signal comprises modulating a bias current to a semiconductor optical amplifier.

3. The method as claimed in claim 1, wherein modulating the drive signal comprises modulating a bias current to a semiconductor optical amplifier synchronously with a tunable element drive signal.

4. The method as claimed in claim 1, wherein controlling the mode-locked operation of the laser swept source comprises modulating a gain of a laser cavity of the laser swept source in response to a wavelength of the laser swept source.

5. The method as claimed in claim 1, wherein modulating the drive signal comprises modulating a bias current to a semiconductor optical amplifier and synchronizing the modulated bias current with a filter sweep drive waveform.

6. The method as claimed in claim 5, further comprising storing a waveform for the bias current and the filter sweep drive waveform in one or more lookup tables.

7. A swept laser system comprising:
a swept laser source for generating a swept optical signal that is frequency tuned over a tuning band, and
a controller for modulating a gain of a laser cavity of the swept laser source based on a wavelength of the swept optical signal during its sweep through a scan band to control passive mode locked operation with a drive signal; and
wherein the controller controls the drive signal to trace a path between unstable operating ranges of lower drive signals and higher drive signals over the scan band in wavelength.

8. The system as claimed in claim 7, wherein the swept laser source comprises:
a gain medium for amplifying light within a laser cavity of the swept laser source to generate the swept optical signal; and
a tuning element for controlling a frequency of the swept optical signal to sweep across a scanband, and
wherein the drive signal applied to the gain medium and the drive voltage to the tuning element are controlled synchronously.

9. The system as claimed in claim 7, wherein the controller controls the mode-locked operation of the swept laser source by modulating bias current to the gain medium, which is a semiconductor optical amplifier.

10. The system as claimed in claim 7, wherein controlling the mode-locked operation of the laser swept source comprises modulating a gain of a laser cavity of the laser swept source in response to a wavelength of the laser swept source.

11. The system as claimed in claim 7, wherein the controller modulates a bias current to a semiconductor optical amplifier of the swept laser source and synchronizes the modulated bias current with a filter sweep drive waveform.

12. The system as claimed in claim 11, wherein the waveform for the bias current and the filter sweep drive waveform are stored in one or more lookup tables.

13. An optical swept source control method, comprising:
providing a laser swept source to generate a swept optical signal;
generating a stability map as a function of wavelength for the laser swept source; and
modulating a drive signal for a gain element of the laser swept source based on the stability map by controlling the drive signal to trace a path between unstable operating ranges of lower drive signals and higher drive signals over the scan band in wavelength.

14. The method as claimed in claim 13, wherein the stability map plots drive current to the gain element as a function of wavelength of the swept optical signal.

15. The method as claimed in claim 13, wherein modulating the drive signal comprises modulating a bias current to a semiconductor optical amplifier of the laser swept source.

16. The method as claimed in claim 13, wherein modulating the drive signal comprises modulating a bias current to a semiconductor optical amplifier synchronously with a tunable element drive signal.

* * * * *